United States Patent [19]

Henry et al.

[11] 3,946,372

[45] Mar. 23, 1976

[54] CHARACTERISTIC TEMPERATURE-DERIVED HARD BUBBLE SUPPRESSION

[75] Inventors: Rodney D. Henry, Fullerton; Paul J. Besser, Laguna Niguel; Robert G. Warren, Anaheim, all of Calif.

[73] Assignee: Rockwell International Corporation, El Segundo, Calif.

[22] Filed: Apr. 15, 1974

[21] Appl. No.: 461,173

[52] U.S. Cl........ 340/174 TF; 340/174 SC; 427/128
[51] Int. Cl.[2]........................................ G11C 11/14
[58] Field of Search................. 340/174 TF, 174 SC

[56] References Cited

UNITED STATES PATENTS

| | | | |
|---|---|---|---|
| 3,506,974 | 4/1970 | Le Craw et al. | 340/174 TF |
| 3,711,841 | 1/1973 | Geusic et al. | 340/174 SC |
| 3,745,046 | 7/1973 | Mee et al. | 340/174 TF |

OTHER PUBLICATIONS

IEEE Transactions on Magnetics "Magnetism of Rare Earth Elements, Alloys, and Compounds" by Rhyne et al.; Vol. Mag. 8, No. 1, 3/72, pp. 105 and 123–125.

*Primary Examiner*—James W. Moffitt
*Attorney, Agent, or Firm*—H. Fredrick Hamann; G. Donald Weber, Jr.; Robert Ochis

[57] ABSTRACT

Normal single wall magnetic or "bubble" domains are generated in bubble domain materials without generating hard bubble domains by selecting the composition based upon a predetermined minimum temperature. This hard bubble suppression is based upon the fact that a bubble domain material of a given composition has a characteristic temperature, $T_H$, above which hard bubble domains are not generated. By selecting the composition to set $T_H$ equal to or less than the minimum ambient temperature for the bubble domain material, hard bubble generation is precluded. Means may be provided for maintaining the bubble domain material at or above $T_H$.

3 Claims, 2 Drawing Figures

CHARACTERISTIC TEMPERATURE-DERIVED HARD BUBBLE SUPPRESSION

CROSS-REFERENCE TO RELATED APPLICATION

Reference is made to the copending United States application of Paul J. Besser entitled ORIENTATION-DERIVED HARD BUBBLE SUPPRESSION, bearing Ser. No. 461,192, filed on Apr. 15, 1974, now abandoned, assigned to the common assignee.

BACKGROUND OF THE INVENTION

1. Field of the Invention

This invention relates to materials in which single wall magnetic domains can exist and, more particularly, to a magnetic domain material suitable for the selective generation of normal, and not hard, single wall magnetic domains.

2. Brief Description of the Prior Art

It is well known in the art to use magnetic materials such as garnets and orthoferrites with intrinsic and/or induced (by shape, stress or growth) uniaxial anisotropy to generate single wall magnetic or bubble domains. Typically, the bubble domains are generated by applying a suitable bias field perpendicular to a sheet or layer of magnetic bubble domain material. The normal bubble domains that are induced in such a material exist over a narrow range of bias field values, typically about 15 Oersteds, and propagate in the direction of an applied bias field gradient. However, in garnet materials, bubble domains may be formed that exist over a range of bias field values of as much as approximately 40 Oersteds. In addition, these unusual bubble domains, termed hard bubbles, have low mobilities and propagate at an angle to the applied bias field gradient. Because of such properties, the presence of hard bubbles may render the garnet material unsuitable for use in bubble domain circuits and devices.

Several techniques are available for suppressing the formation of hard bubble domains. A double layer technique (Type I) is described in an article by A. H. Bobeck et al., published in the Bell System Technical Journal, VOl. 51, pgs. 1431–35, July–August, 1972. In this technique, a garnet layer (suppression layer) of low magnetic moment is interposed between a garnet bubble domain layer and a substrate. The application of a suitable bias field to form bubble domains in the bubble layer saturates the suppression layer, precluding the formation of bubble domains therein and magnetizing the entire suppression layer antiparallel to the bubble domains. As a result of the antiparallel directions of magnetization, domain walls are formed between the intermediate layer and the bubble domains, "capping" the domains. These extra domain walls, termed 180° walls or caps because of the antiparallel magnetization, apparently suppress the formation of hard bubbles in the bubble layer by limiting the degrees of freedom available to the domain wall geometry. The usefulness of the Type I double layer suppression technique is limited by (1) the propensity of the suppressed bubble layer to spontaneously generate unwanted bubbles and (2) the tendency of domains to split or segment when they are stretched for the purpose of detection.

Another double layer suppression technique (Type II) is described in the paper by A. H. Bobeck et al., supra. This technique utilizes a garnet bubble domain layer having a magnetization compensation temperature below room temperature. A garnet layer which is interposed between the bubble layer and a supporting substrate possesses a lower moment than the bubble layer and has a compensation temperature which is above room temperature. Upon application of an external bias field to form bubble domains in the bubble domain layer and to saturate the interposed layer, the d-site Fe sublattices of the interposed layer and the non-bubble regions of the bubble domain layer are magnetized in antiparallel directions. This creates interfacial domain walls external to the bubble domains. That is, domain walls are created at the interface of the two layers between, but not along, the lower ends of the bubble domains. The authors report that hard bubbles are eliminated by such a domain wall. However, the operability of this arrangement is obviously limited to a narrow temperature range and may be temperature sensitive within this range.

A single-layer hard bubble suppression technique that utilizes ion implantation to form a wall or boundary in the upper surface of a magnetostrictive garnet bubble domain layer is described by R. Wolf and J. C. North in the Bell System Technical Journal, VOl. 51, pgs. 1436–1440, July–August, 1972. The ion implantation is accomplished in a thin region in the upper surface of the garnet layer. The constraints exerted by the rest of the layer on the implanted region create a new moment of magnetization parallel to the surface and perpendicular to the direction of magnetization of the bubble domains. The magnetization of the implanted region apparently creates an extra domain wall, a 90° cap, in bubble domains induced in the unimplanted region of the layer, thereby eliminating hard bubble domains by decreasing the number of available degrees of freedom. However, from a practical standpoint, the ion implantation technique is limited to garnet materials having negative magnetostriction constants of relatively large absolute values. In addition, the ion implanted region physically separates the generation and other device structures from the bubble domain layer and presumably renders bubble devices formed therefrom less flexible in design.

Another hard bubble suppression technique, also a 90° capping technique, is disclosed in copending United States patent application Ser. No. 375,999, entitled MAGNETIC BUBBLE DOMAIN COMPOSITE WITH HARD BUBBLE SUPPRESSION, by Rodney D. Henry and Paul J. Besser, filed July 2, 1973, now abandoned, and assigned to the common assignee. This 90° capping technique utilizes a magnetic garnet, hard bubble suppression layer that may be (1) interposed between a bubble domain layer and a supporting substrate or (2) formed directly on the bubble domain layer, which itself is grown on the substrate. The hard bubble suppression layer has stress-induced anisotropy such that there is an easy axis of magnetization which is approximately parallel to the interfacial plane of the bubble domain and the suppression layers and perpendicular to the direction of magnetization of the bubble domains. Because the easy axis of magnetization of the suppression layer is parallel to the plane of the bubble domain layer, (90° relative to the bubble domain magnetization direction), the suppression layer forms an extra domain wall or cap to the bubble domain.

Although prior art suppression techniques may be highly effective, they require additional processing steps and/or structures. As may be appreciated, it is desirable to have a hard bubble suppression technique that eliminates the cost in time and money of such additional processing.

SUMMARY OF THE INVENTION

The present invention comprises a sheet or layer of material in which normal single wall magnetic or bubble domains may be selectively generated without generating hard bubbles. The invention utilizes the discovery that there is a composition-dependent characteristic temperature, $T_H$, for bubble domain materials. When the bubble domain material is maintained at or above $T_H$, normal domains can be generated therein. However, hard bubbles cannot be generated therein. The composition of the bubble domain material is selected such that $T_H$ is, at most, equal to a predetermined minimum operating temperature. Provision may be made for maintaining the temperature of the bubble domain material above the characteristic temperature.

DETAILED DESCRIPTION

Figure 1:
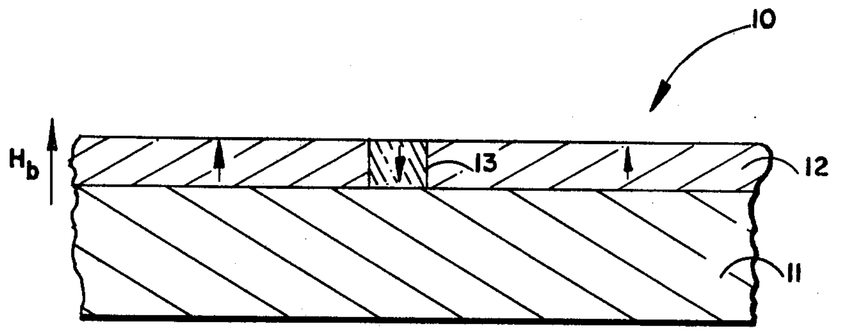
FIG. 1 is a partial, cross-sectional view of a bubble domain composite embodying the principles of the present invention.

Referring now to FIG. 1, there is shown a partial, cross-sectional representation of a bubble domain composite, designated generally by the reference numeral 10, constructed in accordance with the principles of the present invention. The bubble domain composite 10 comprises a substrate 11 which supports a layer 12 of bubble domain material. Bubble domains 13 (only one is shown), i.e., cylindrical-shaped regions which are enclosed by individual domain walls and are magnetized anti-parallel to the magnetization of the layer 12, can exist within the layer upon the application of a suitable bias field, $H_b$, perpendicular to the plane thereof.

The substrate 11 typically comprises a monocrystalline oxide material, e.g., a metal oxide such as a non-magnetic garnet. As used here, the term "non-magnetic garnet" refers to garnet materials containing no iron or insufficient iron to supply the magnetic characteristics necessary for the formation of bubble domains. The non-magnetic garnets are considered to be oxides designated by the general formula $J_3Q_5O_{12}$, where J is at least one element selected from the lanthanide series of the Periodic Table, lanthanum, yttrium, magnesium, calcium, strontium, barium, lead, cadmium, lithium, sodium, and potassium. The Q constituent is at least one element selected from gallium, indium, scandium, titanium, vanadium, chromium, silicon, germanium, manganese, rhodium, zirconium, hafnium, molybdenum, niobium, tantalum, tungsten and aluminum.

The bubble domain layer 12 typically comprises a monocrystalline layer of magnetic material such as magnetic garnet. The magnetic garnets are hereby considered to be oxides designated by the general formula $J_3Q_5O_{12}$, where J is one or more of the elements of the lanthanide series of the Periodic Table, calcium, bismuth, strontium, lanthanum and yttrium, and Q is iron alone (and $J_3Q_5O_{12}$ is thus an iron garnet) or iron and one or more elements selected from the group consisting of aluminum, chromium, gallium, germanium, indium, manganese, scandium, titanium and vanadium ($J_3Q_5O_{12}$ is a substituted iron garnet).

The monocrystalline bubble domain layer 12 may be epitaxially grown on the substrate 11 using standard growth techniques such as liquid phase epitaxy (LPE), chemical vapor deposition (CVD), physical vapor deposition (PVD) and the like. The formation of composites of monocrystalline iron garnet bubble domain layers on a monocrystalline metallic oxide substrate is disclosed in copending U.S. patent application Ser. No. 233,832, a continuation application of U.S. application Ser. No. 16,447, and in U.S. Pat. No. 3,645,788, both to Mee et al. and assigned to the common assignee. These teachings are herein incorporated by reference. Of course, certain bubble domain materials may comprise a self-supporting layer, rather than a layer 12 supported by a substrate 11.

As is well known in the art, to generate bubble domains in a layer of magnetic garnet material, the layer is grown such that induced magnetic anisotropy therein provides an easy axis of magnetication approximately normal to the layer plane. Accordingly, induced magnetic anisotropy, i.e., an induced easy axis of magnetization, is used where the bubble domain layer 12 is a garnet. Preferably, this induced easy axis coincides with one of the crystallographic (intrinsic) easy axes.

The existing hard bubble suppression techniques, i.e., multilayer or ion implantation techniques, utilize exchange coupling between multiple layers or regions of magnetic material, presumably to create extra domain walls such as the aforementioned 90° and 180° caps. Although the mechanism of suppression is not fully understood, it is believed that the degrees of freedom available to the bubble domains are decreased to a number that precludes the existence of hard bubbles, yet is consistent with the existence of bubbles having nearly normal characteristics.

The present invention utilizes the inventors' discovery that, for materials such as garnets, the formation of hard bubbles is temperature dependent. It has been found that bubble domain materials have a characteristic temperature above which hard bubbles are not generated. This characteristic temperature, hereafter designated $T_H$, exists even for unsuppressed garnet bubble domain materials. Furthermore, it has been discovered that $T_H$ is different for different compositions. These discoveries may be utilized to provide hard bubble suppression by lowering $T_H$ to a value that is equal to or less than a predetermined minimum temperature to which a bubble domain composite will be subjected.

EXAMPLES

Table 1 summarizes the parameters utilized and the results obtained for samples comprising various compositions of bubble domain material according to the present invention. With the exception of the composite termed sample number 1, the garnet bubble domain layers and the resulting composites were grown using the LPE dipping method reported by Levinstein et al. in "The Growth of High Quality Garnet Thin Films from Supercooled Melts", Applied Physics Letters, Vol. 19, pages 486–488 (December 1971). This report, which is hereby incorporated by reference, teaches the use of a 920°C growth temperature and a $PbO$-$B_2O_3$ flux for the LPE dipping method. The bubble domain layers were deposited using horizontal substrates that were rotated 30 to 100 rpm during the growth cycle, as described by Geiss et al. in "Liquid Phase Epitaxial Growth of Magnetic Garnets," Vol. 16, pages 36–42, (1972), which is hereby incorporated by reference.

The composite number 1 was grown by chemical vapor deposition (CVD). The CVD growth method utilized the appropriate anhydrous metal chlorides as the film constituent ion sources. The deposition system was essentially the same as that reported by J. E. Mee et al. in "Magnetic Oxide Films," IEEE Transactions on Magnetics, Vol. Mag -5, No. 4 (December 1969). This report is hereby incorporated by reference. The chlorides were heated in individually-controlled furnace zones. This controlled the vapor pressure of each ion source, the transport of the halide and, therefore, the resultant film composition. A vapor mixture of hydrogen chloride and helium was passed over the source materials to transport the vapor mixture containing the film constituent ions to the deposition zone. Oxygen-helium vapor mixtures were introduced into the reactor so that the mixture of transported vapor of source materials and hydrogen chloride reacted with the oxygen in a reactor deposition zone maintained at 1150°C to form an epitaxial magnetic garnet film on a gadolinium gallium garnet substrate.

acteristic temperatures, $T_H$, of 150°, 115° and 20°C are attained.

Referring again to Table 1, the effect of composition on $T_H$ is illustrated by sample nos. 4 and 5. Both of these samples are identical except for the addition of minute concentrations of cobalt and silicon to sample 4. However, as a result of the slight composition change, the characteristic temperature for sample no. 4 is 35°C higher than that of sample no. 5.

Characterization of the samples indicates that the generation of hard bubbles, not the existence of hard bubbles, is prohibited by operation above $T_H$. That is, and referring to FIG. 2, if bubbles are produced when the composites are below $T_H$ (i.e., when the composites are at the temperatures corresponding to points *a*) and the bubble domain layers are then raised above $T_H$, $\Delta H_b$ remains at high, nearly constant values. If the existence of hard bubbles were prohibited above $T_H$, $\Delta H_b$ should decrease significantly after the temperature is raised. Instead, the constant values for $\Delta H_b$ suggest that the hard bubbles generated at lower temperatures remain in the bubble domain layers at temperatures which exceed $T_H$.

Characterization of sample no. 6 indicates that hard bubbles can be created even in suppressed bubble domain films and that suppressed layers or films have a

TABLE 1

CHARACTERISTIC TEMPERATURE, $T_H$, OF EPITAXIAL GARNETS

| SAMPLE NO. | BUBBLE DOMAIN LAYER COMPOSITION | DEPOSITION METHOD | SUBSTRATE COMPOSITION | $T_H$(°C) |
|---|---|---|---|---|
| 1[a] | $(YGd)_3Ga_{1.0}Fe_{4.0}O_{12}$ | CVD | $Gd_3Ga_5O_{12}$ | 60 |
| 2 | $Eu_{0.8}Er_{2.2}Ga_{0.8}Fe_{4.2}O_{12}$ | LPE | $Gd_3Ga_5O_{12}$ | 110 |
| 3 | $Y_{2.4}Eu_{0.6}Ga_{1.1}Fe_{3.9}O_{12}$ | LPE | $Gd_3Ga_5O_{12}$ | 90 |
| 4[b] | $(YGdTm)_3Ga_{0.8}Fe_{4.18}Co_{0.01}Si_{0.01}O_{12}$ | LPE | $Gd_3Ga_5O_{12}$ | 150 |
| 5[b] | $(YGdTm)_3Ga_{0.8}Fe_{4.2}O_{12}$ | LPE | $Gd_3Ga_5O_{12}$ | 115 |
| 6[b,c] | $(YGdTm)_3Ga_{0.8}Fe_{4.2}O_{12}$ | LPE | $Gd_3Ga_5O_{12}$ | 20 |
| 7[b,d] | $(YGdTm)_3Ga_{0.8}Fe_{4.2}O_{12}$ | LPE | $Gd_3Ga_5O_{12}$ | −40 |

NOTES:
[a]$(YGd)_3$ composition was $Y_{2.5}Gd_{0.5}$
[b]$(YGdTm)_3$ composition was $Y_{1.08}Gd_{0.72}Tm_{1.2}$
[c]ion implanted at 50 kev to $1 \times 10^{16} H^+ cm^{-2}$
[d]ion implanted at 50 kev to $3 \times 10^{16} H^+ cm^{-2}$ The composition used throughout for the substrates 11 (FIG. 1) was $Gd_3Ga_5O_{12}$ (gadolinium gallium garnet). The above-described LPE and CVD techniques were used to grow bubble domain layers 12 of [111] orientation (FIG. 1) to a thickness of approximately 5–6 microns on gadolinium gallium garnet substrates 11 (FIG. 1) of [111] orientation. The compositions of the bubble domain layers are set forth in Table 1.

The sample composites were characterized for the presence or absence of hard bubble domains by determining the range of values of the bias field, $\Delta H_b$ (Oersteds), which was necessary for bubble domain collapse. Since a collapse field range of 2 Oe. or less indicates the existence of normal bubbles without the presence of hard bubbles, the effective characteristic temperature $T_H$ was chosen to be that temperature at which the collapse field range is 2 Oe.

Figure 2:
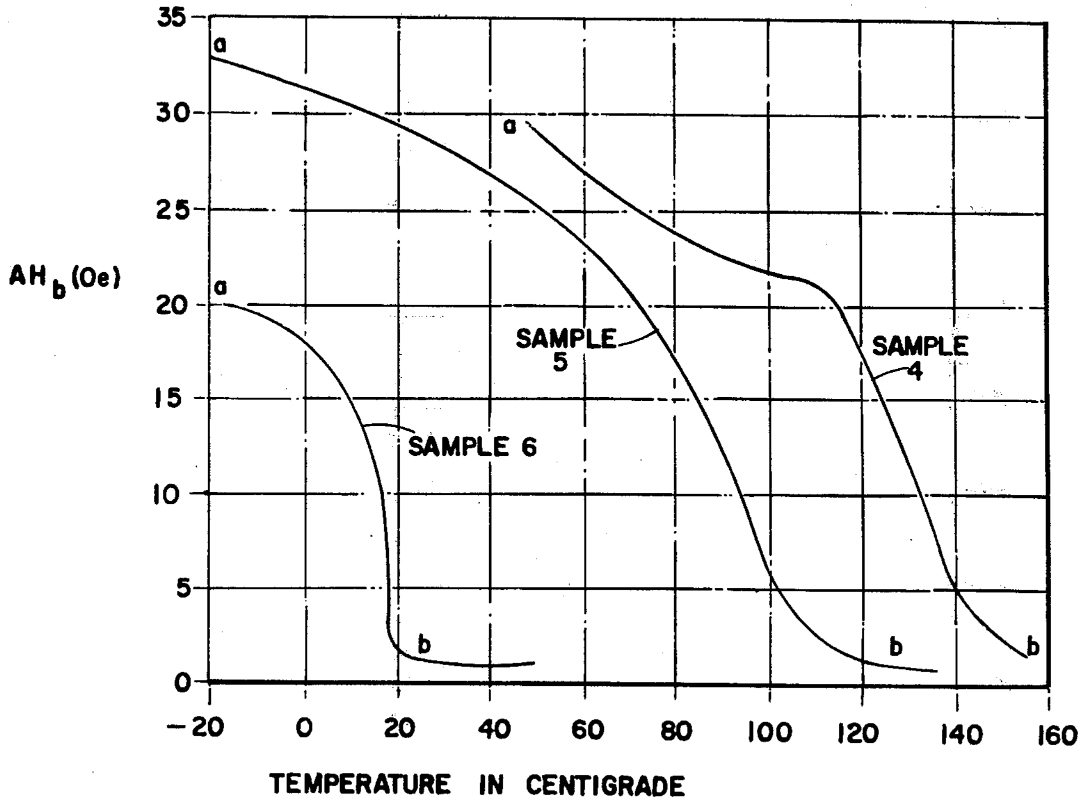
FIG. 2 is a graphical illustration of the temperature dependence of the collapse field of garnet bubble domain materials.

FIG. 2 shows the effect of composition on $\Delta H_b$ (and, therefore, $T_H$) for three $(YGdTm)_3(FeGa)_5 O_{12}$ bubble domain layers, sample nos. 4–6. Similar curves were obtained for all the sample composites listed in Table 1. As shown in FIG. 2, at lower temperatures $\Delta H_b$ is usually 25 Oersteds or greater, indicating that hard bubbles are present. However, as shown for the exemplary samples nos. 4–6, the collapse field ranges decrease with increasing temperature until the respective charcharacteristic temperature. Sample no. 6 has a bubble domain layer of the same composition as that of sample no. 5, except that the layer of sample no. 6 has been implanted with $1 \times 10^{16}$ protons/cm$^2$. Referring to the curve for sample no. 6 in FIG. 2, if bubbles are initially produced at the temperature corresponding to point *a* and the temperature of the bubble domain layer is then raised to point *b*, $\Delta H_b$ remains nearly constant at 20 Oe. The high $\Delta H$ value indicates that hard bubbles exist in the bubble layer throughout the temperature range. But, if the temperature of the bubble domain layer is at or above about 20°C before bubbles are generated therein, $\Delta H_b$ is less than 2 Oe, indicating that 20°C is the characteristic temperature above which the generation of hard bubbles is prohibited.

Figure 3:
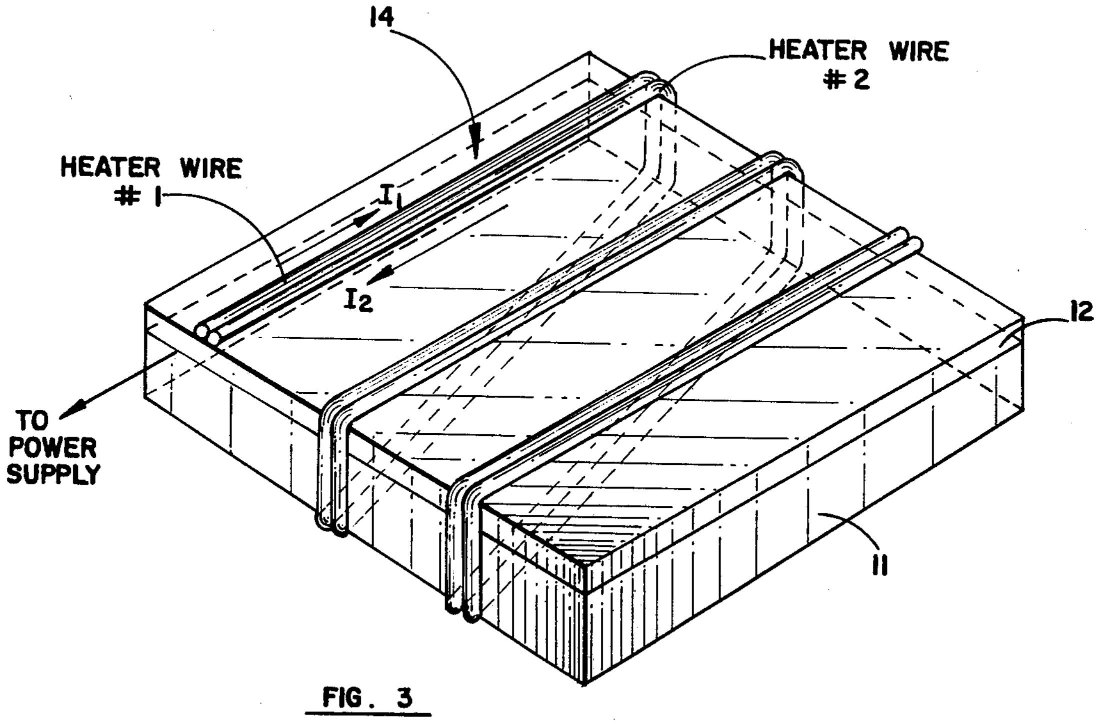
FIG. 3 is an isometric representation of a bubble domain composite and means for maintaining the temperature of the bubble domain material at or above the characteristic temperature in accordance with the principles of the present invention.

If the hard bubble characteristic temperature is above the minimum ambient temperature to which the bubble domain material will be subjected, heating means may be provided. For example, and referring to FIG. 3, one can use a simple electrical heater wire 14 having a bifilar winding to maintain the temperature of the bubble domain layer 12 at or above $T_H$ while insuring that magnetic fields from the currents $i_1$ and $i_2$ in the heater wires are not seen by the layer 12.

Although the mechanism of $T_H$ is not known, one clue is provided by the tendency of isolated stripe domains to align in the same direction prior to bubble formation if $H_b$ is slowly increased starting at a temperature above $T_H$. Such an alignment of stripe domains indicates a possible in-plane anistopy having a one-fold or two-fold dependence which causes the domains to align. While a one-fold dependence might appear physically unreasonable, it should be noted that terms with cosine $2\theta$ symmetry and cosine $3\theta$ symmetry can be combined to produce unidirectional symmetry. In an attempt to verify the supposition, FMR techniques were used to investigate the in-plane resonance fields of samples 4 and 5.

The FMR investigation showed that, at or near room temperature, the parallel resonance fields of samples 4 and 5 have an anistropy with a cosine $2\theta$ dependence. This dependence is one order of magnitude too large for sample misalignment, suggesting that the bubble domain materials have uniaxial in-plane anistropy at this temperature, since any misalignment or intrinsic contributions from cubic terms should have a cosine $3\theta$ or cosine $6\theta$ dependence. It appears more significant that as the temperature was increased past $T_H$, a cosine $3\theta$ term appears and increased until it was comparable in amplitude to the cosine $2\theta$ term. Consequently, it is logical to predict the existence of the uniaxial or one-fold anistropy referred to in the preceding paragraph. It is suggested that this cosine term is related to the cubic or the stress-induced contributions to the anistropy. In both cases its appearance coincides with the onset of $T_H$.

Thus, it seems likely that hard bubble suppression in "uncapped" layers or films is a function of the magnitude of the cosine $3\theta$ anistropy term relative to the uniaxial term. Suppression of the generation of hard bubbles then requires that the cosine $3\theta$ term be comparable to the uniaxial term. This conclusion explains the decrease in $T_H$ with increasing concentrations of implanted ions. For example, if the proton concentration for the bubble domain layer of sample 6 is increased to $3 \times 10^{16}$ protons/cm$^2$ as shown for sample no. 7, $T_H$ is reduced to, and hard bubble suppression becomes effective to, about $-40$°C. This decrease in $T_H$, which is presumed to result from the earlier appearance of the cosine $3\theta$ term, is consistent with the possibility that ion implantation can increase the three-fold symmetry.

Thus, there has been described a stratified magnetic bubble domain composite that generates only normal bubble domains at or above a predetermined characteristic temperature. This characteristic temperature, $T_H$, is dependent upon the composition of the bubble domain material. Exemplary compositions have been demonstrated. Alternative compositions will be readily achieved by those skilled in the art. Accordingly, the scope of the invention is limited only by the claims appended hereto.

Having thus described the preferred embodiment of the invention, what is claimed is:

1. A stratified magnetic composite for selectivity generating single wall magnetic domains, comprising:

a monocrystalline garnet substrate;

a monocrystalline layer of magnetic garnet materials supported by said substrate and having such a garnet composition that only normal single wall magnetic domains can be formed therein above a critical tempertaure, the composition of said layer being substantially uniform throughout the thickness of said layer; and means for maintaining the temperature of said layer at a temperature above said critical temperature and below the Neel temperature of said layer.

2. An arrangement for selectively generating single wall magnetic domains, comprising:

a monocrystalline layer of a magnetic garnet material, the composition of said layer being such that only normal single wall magnetic domains can be generated therein above a critical temperature;

means for maintaining said layer at a temperature above said critical temperature of said layer and below the Neel temperature of said layer; and means for controllably generating single wall magnetic domains in said layer.

3. A method of selectively controlling the generation of hard single wall magnetic domains in a composite comprising a monocrystalline garnet substrate and a monocrystalline layer of magnetic garnet material supported by said substrate and having such a garnet composition that only normal single wall magnetic domains can be formed therein above a critical temperature, the composition of said layer being substantially uniform throughout the thickness of said layer, said method comprising:

determining the critical temperature for the composite; and regulating the temperature of said layer with respect to said critical temperature to maintain the temperature of said layer above said critical temperature to prevent the generation of hard single wall magnetic domains.

* * * * *